US 8,018,075 B2

(12) United States Patent
Chang et al.

(10) Patent No.: US 8,018,075 B2
(45) Date of Patent: Sep. 13, 2011

(54) SEMICONDUCTOR PACKAGE, METHOD FOR ENHANCING THE BOND OF A BONDING WIRE, AND METHOD FOR MANUFACTURING A SEMICONDUCTOR PACKAGE

(75) Inventors: Hsiao Chuan Chang, Kaohsiung (TW); Tsung Yueh Tsai, Kaohsiung County (TW); Yi Shao Lai, Yonghe (TW); Ho Ming Tong, Taipei (TW); Jian Cheng Chen, Tainan County (TW); Wei Chi Yih, Taichung (TW); Chang Ying Hung, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 117 days.

(21) Appl. No.: 12/501,309

(22) Filed: Jul. 10, 2009

(65) Prior Publication Data
US 2010/0007010 A1 Jan. 14, 2010

Related U.S. Application Data

(60) Provisional application No. 61/079,811, filed on Jul. 11, 2008.

(30) Foreign Application Priority Data

Nov. 6, 2008 (TW) ................ 97142797 A

(51) Int. Cl.
H01L 23/48 (2006.01)
H01L 21/44 (2006.01)

(52) U.S. Cl. ................ 257/780; 257/784; 257/E23.124; 257/E23.024; 257/E21.504; 257/E21.509; 438/617

(58) Field of Classification Search ........................ None
See application file for complete search history.

(56) References Cited

U.S. PATENT DOCUMENTS

| | | | | |
|---|---|---|---|---|
| 5,318,651 A * | 6/1994 | Matsui et al. | ............... | 156/273.5 |
| 6,091,140 A * | 7/2000 | Toh et al. | ...................... | 257/691 |
| 7,115,446 B2 | 10/2006 | Koo et al. | | |
| 2005/0224959 A1* | 10/2005 | Kwon et al. | ................... | 257/723 |
| 2006/0043612 A1* | 3/2006 | Magno et al. | ................. | 257/784 |
| 2009/0085220 A1* | 4/2009 | Bernhardt et al. | ............ | 257/777 |

* cited by examiner

Primary Examiner — Alonzo Chambliss

(57) ABSTRACT

A wire bonding structure of a semiconductor package includes a bonding wire, a pad and a non-conductive adhesive material. The bonding wire includes a line portion and a block portion, wherein the block portion is physically connected to the line portion, and the sectional area of the block portion is bigger than that of the line portion. The pad is bonded to the block portion. The non-conductive adhesive material covers the pad and seals the whole block portion of the bonding wire.

20 Claims, 11 Drawing Sheets

SEMICONDUCTOR PACKAGE, METHOD FOR ENHANCING THE BOND OF A BONDING WIRE, AND METHOD FOR MANUFACTURING A SEMICONDUCTOR PACKAGE

CROSS REFERENCE TO RELATED APPLICATION

This application claims the priority benefit of U.S. Patent Application Ser. No. 61/079,811, filed on Jul. 11, 2008 and Taiwan Patent Application Serial Number 097142797, filed on Nov. 6, 2008, the full disclosure of which is incorporated herein by reference.

BACKGROUND OF THE INVENTION

1. Field of the Invention

The present invention generally relates to a method for enhancing the bond of a bonding wire, and more particularly to a wire bonding structure of a semiconductor package including a non-conductive adhesive material which covers an aluminum pad and seals the whole block portion of a copper bonding wire.

2. Description of the Related Art

Referring to FIG. 1, according to a process for manufacturing a semiconductor package, the technology of wire bonding process widely applied to the electrical connection between a pad 11 of a chip 10 and a pad 13 of a substrate 12 by using a bonding wire 14. Wire bonding process is mainly based on gold (Au) wires, but copper (Cu) wire has an advantage of low cost. Compared with the gold, the copper has better electric conductivity and thermal conductivity, whereby the copper bonding wire has thinner diameter of wire and better dissipation of heat. However, the copper has disadvantage of insufficient ductility and easy oxidation such that the utilization of the copper bonding wire is restricted.

Recently, the copper bonding wire is only applied to a chip pad with a big size or low dielectric material (low-k) of wafer, because the success of the wire bonding process of the copper bonding wire depends on the structural strength of the chip pad. In order to avoid the failure of the wire bonding process of the copper bonding wire, the small size of the chip pad will be limited.

Referring to FIGS. 2 to 4, they depict a conventional method for bonding a copper bonding wire. Referring to FIG. 2, a copper bonding wire 20 is provided by a wire bonding machine, wherein the copper bonding wire 20 has a copper line 22 and a copper ball 24. The copper ball 24 is physically connected to an end of the copper line 22 by a discharging electricity manner or a burning hydrogen manner. Referring to FIG. 3, the copper ball 24 is pressed and then deformed. Referring to FIG. 4, the deformed copper ball 24 is bonded to an aluminum (Al) pad 32 by a vibration process. However, the prior art fails to disclose an additional adhesive force for enhancing the bond between a copper bonding wire and an aluminum pad.

U.S. Pat. No. 7,115,446 B2, entitled "Flip Chip Bonding Method For Enhancing Adhesion Force In Flip Chip Packaging Process And Metal Layer-built Structure Of Substrate For The Same", discloses that a method for packaging flip chip and a substrate structure can enhance the bond between a chip 50 and substrate 52 by forming bumps 54 on pads 51 of the chip 50 or pads 53 of the substrate 52.

Referring to FIG. 5, although an adhesive layer 56 disclosed in the U.S. Pat. No. 7,115,446 B2 can enhance the adhesive force during the bonding processes of flip chip, the adhesive layer 56 is not applied to the bonding process of the bonding wire. Furthermore, the adhesive layer 56 does not seal the whole bump 54, and thus the adhesive layer 56 cannot generate the effect upon mold lock.

Accordingly, there exists a need for a method for enhancing the bond of a bonding wire capable of solving the above-mentioned problems.

SUMMARY OF THE INVENTION

The present invention provides a wire bonding structure of a semiconductor package includes a bonding wire, a pad and a non-conductive adhesive material. The bonding wire includes a line portion and a block portion, wherein the block portion is physically connected to the line portion, and the sectional area of the block portion is bigger than that of the line portion. The pad is bonded to the block portion. The non-conductive adhesive material covers the pad and seals the whole block portion of the bonding wire.

According to the wire bonding structure of the present invention, the non-conductive adhesive material covers the aluminum pad and seals the whole block portion of the copper bonding wire, thereby enhancing the bond between the copper bonding wire and the aluminum pad. Furthermore, according to the above-mentioned wire bonding structure of the present invention, the non-conductive adhesive material covers the aluminum pad and seals the whole block portion of the copper bonding wire, thereby generating the effect upon mold lock. In addition, the non-conductive adhesive material covers the aluminum pad and seals the whole block portion of the copper bonding wire, thereby preventing the copper bonding wire from oxidation and electric leakage so as to cause the aluminum pads to have fine pitch.

The foregoing, as well as additional objects, features and advantages of the invention will be more apparent from the following detailed description, which proceeds with reference to the accompanying drawings.

DETAILED DESCRIPTION OF THE PREFERRED EMBODIMENT

Figure 1:
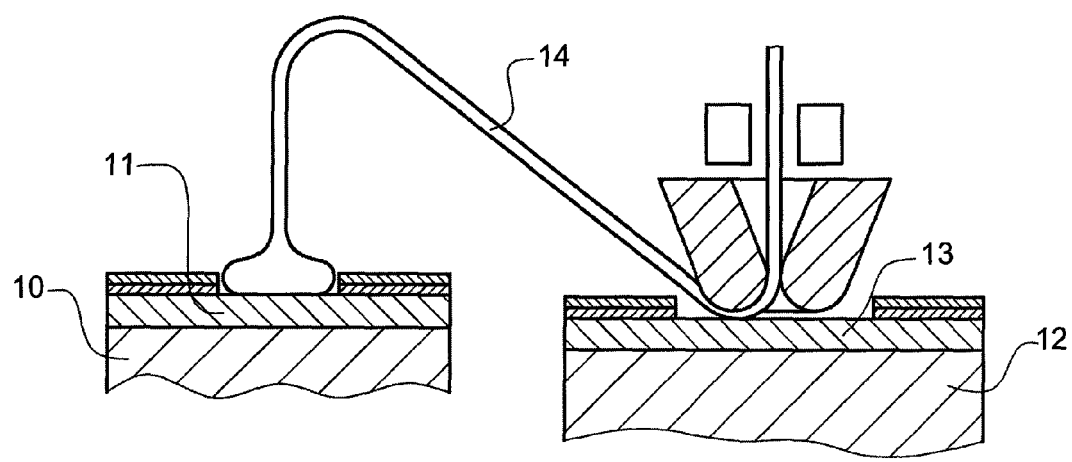
FIG. 1 is a cross-sectional view showing a method for bonding a wire in the prior art.
Figure 2:
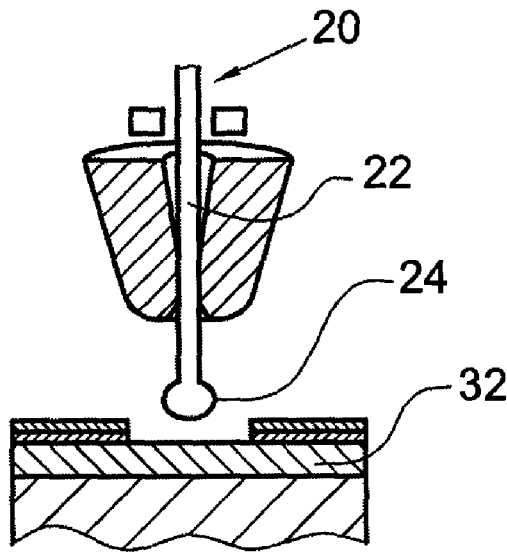
FIGS. 2 to 4 are cross-sectional views showing a method for bonding a copper bonding wire in the prior art.
Figure 3:
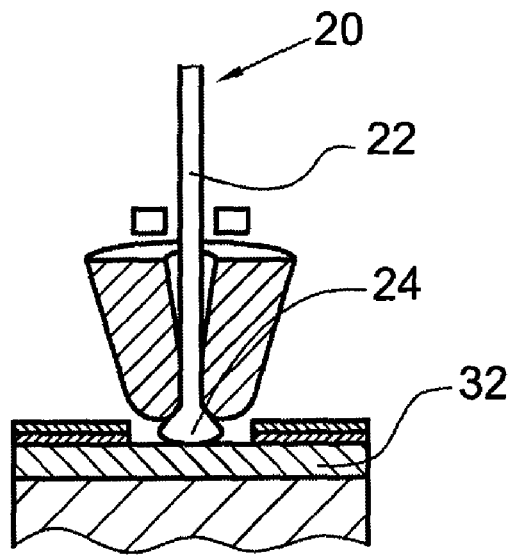
Figure 4:
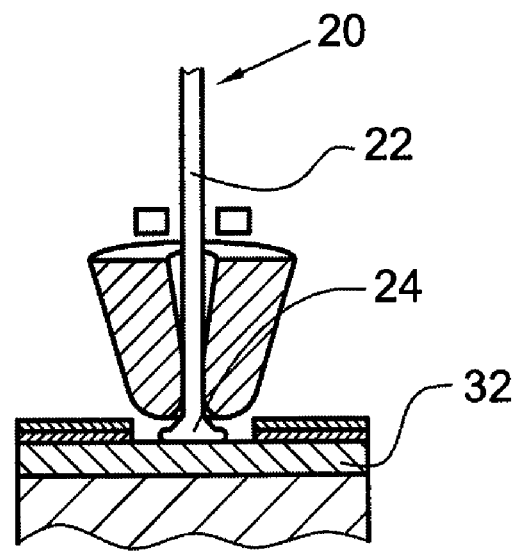
Figure 5:
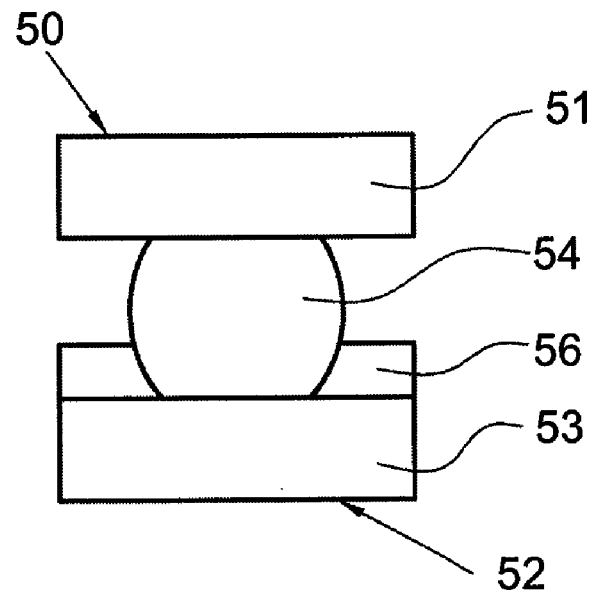
FIG. 5 is a cross-sectional view showing a method for bonding flip chip in the prior art.
Figure 6:
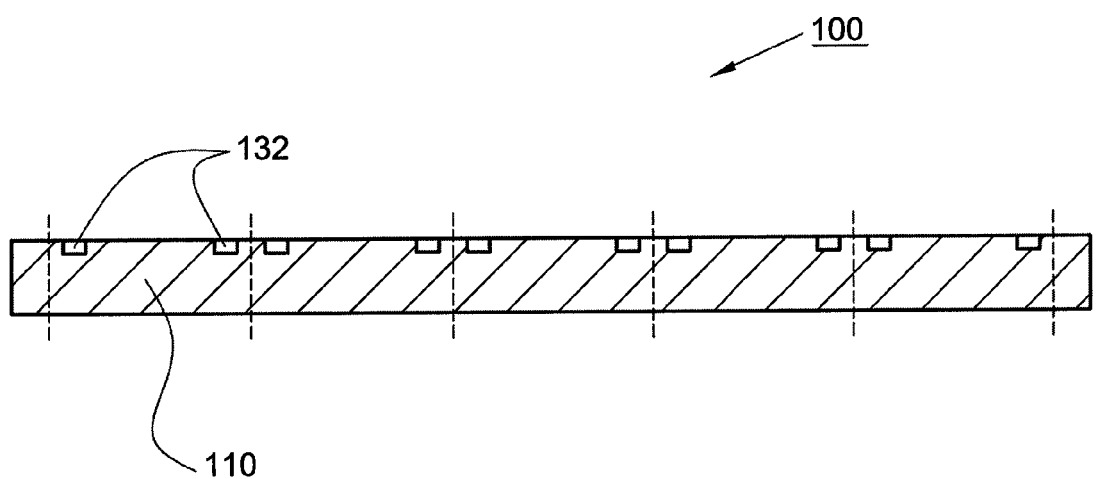
FIGS. 6 to 10, 11a, 11b, and 12 to 16 are cross-sectional views showing a method for manufacturing a semiconductor package according to the first embodiment of the present invention.
Figure 7:
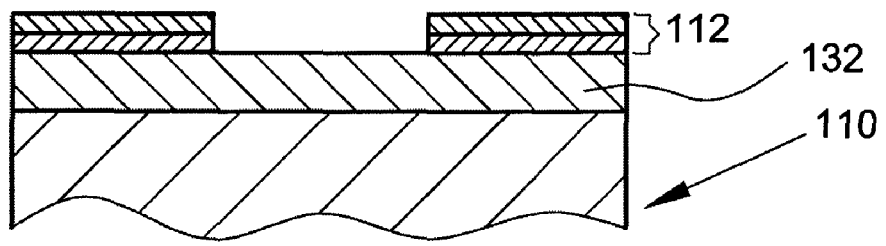
Figure 8:
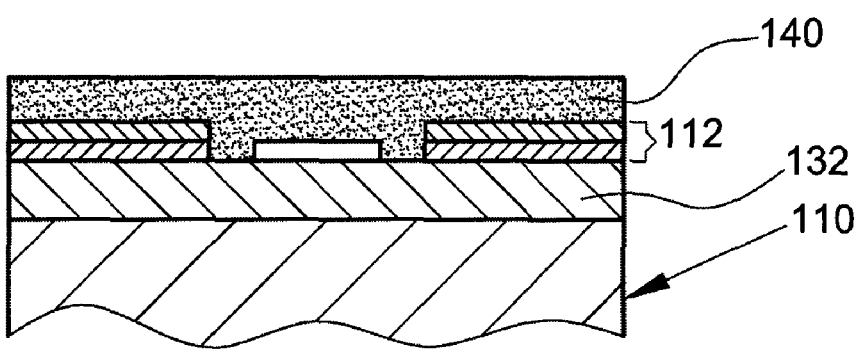

Referring to FIGS. 6 to 17, they depict a method for manufacturing a semiconductor package according to the first embodiment of the present invention. Referring to FIG. 6, a wafer 100 is provided, wherein the wafer 100 defines a plurality of chips 110 arranged in array manner. Referring to FIG. 7, it depicts a partially expanded cross-section of the chip 110. Each chip 110 includes a passivating layer 112 and at least one pad (e.g. aluminum pad 132). The aluminum pad 132 is electrically connected to the circuit of the chip 110. The passivating layer 112 covers the aluminum pad 132 and exposes a part of the aluminum pad 132. Referring to FIG. 8, a non-conductive adhesive material 140 is formed on the aluminum pad 132. The forming step of the non-conductive adhesive material 140 can include the following steps: the non-conductive adhesive material 140 is formed on the aluminum pad 132 by a spin coating process, and then the non-conductive adhesive material 140 is solidified from a liquid state to a half-solid state. Or, the forming step of the non-conductive adhesive material 140 can include the following steps: the non-conductive adhesive material 140 is formed on the aluminum pad 132 by a printing process, and then the non-conductive adhesive material 140 (e.g. typical adhesive) is solidified from a liquid state to a half-solid state. Or, the forming step of the non-conductive adhesive material 140 can include the following step: the non-conductive adhesive material 140 which is in a half-solid state is directly disposed on the aluminum pad 132.

Figure 9:
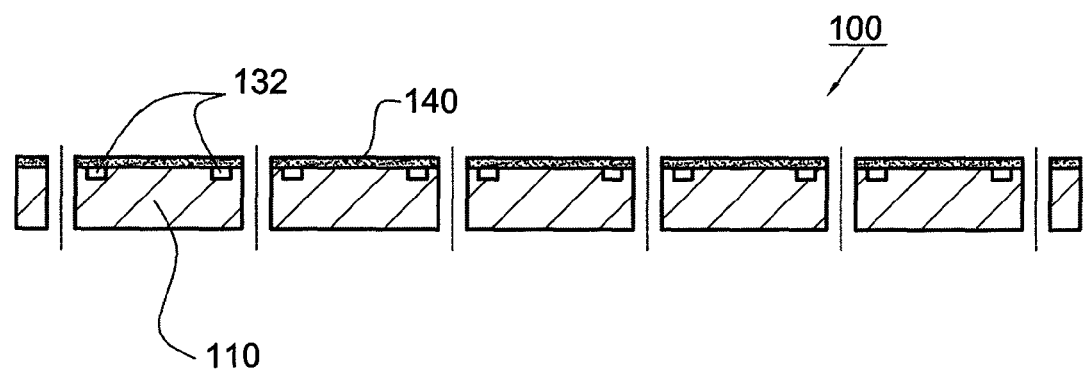
Figure 10:
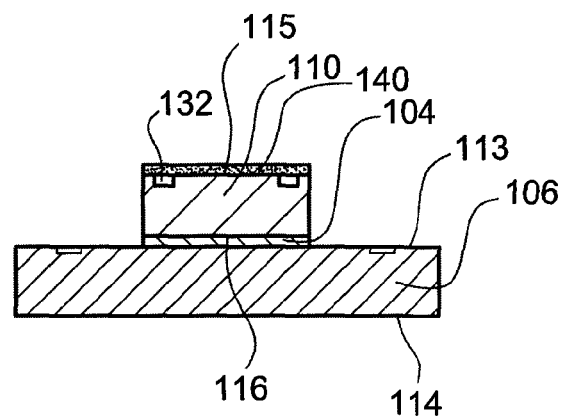

Referring to FIG. 9, the wafer 100 is sawed to a plurality of chips 110 so as to form the chips 110 having the aluminum pad 132 and the non-conductive adhesive material 140 of the present invention. Referring to FIG. 10, the chip 110 is mounted on a carrier 106 by an adhesive 104. The carrier 106 can be a substrate or a leadframe. The carrier 106 has an upper surface 113 and a lower surface 114 opposite to the upper surface 113. A chip 110 is disposed on the carrier 106, wherein the chip 110 has an active surface 115 and a back surface 116 opposite to the active surface 115, and the back surface 116 of the chip 110 is located on the upper surface 113 of the carrier 106. The aluminum pad 132 is disposed on the active surface 215 of the chip 110.

Figure 11A:
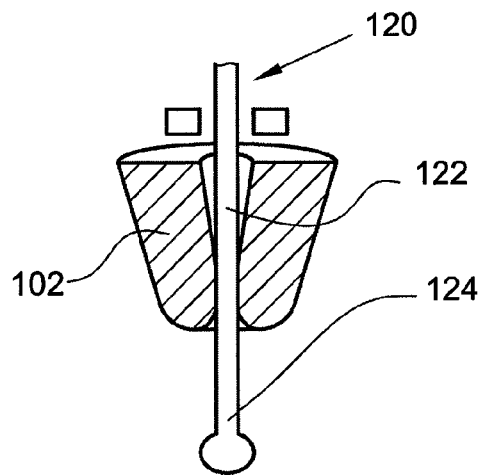
Figure 11B:
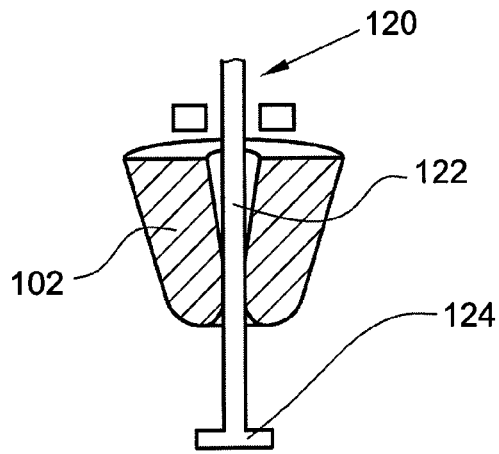

Referring to FIGS. 11a and 11b, a bonding wire (e.g. copper bonding wire 120) is provided by a wire bonding machine 102, wherein the copper bonding wire 120 has a line portion 122 and a block portion 124, wherein the block portion 124 is physically connected to an end of the line portion 122, and the cross-sectional area of the block portion 124 is bigger than that of the line portion 122. The block portion 124 can be spherical or non-spherical.

Figure 12:
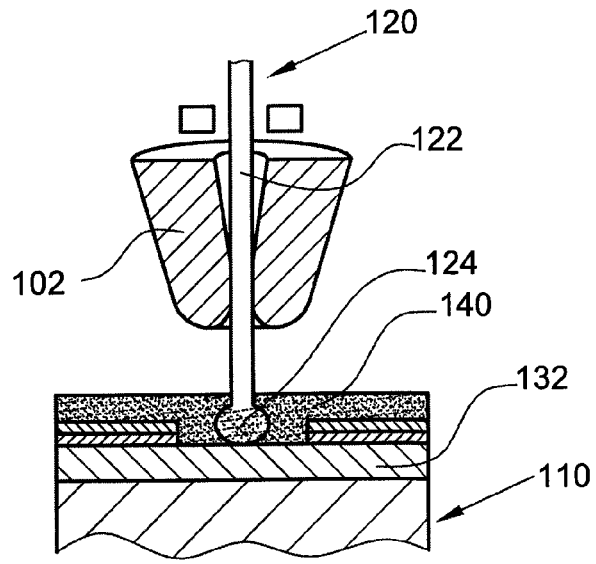
Figure 13:
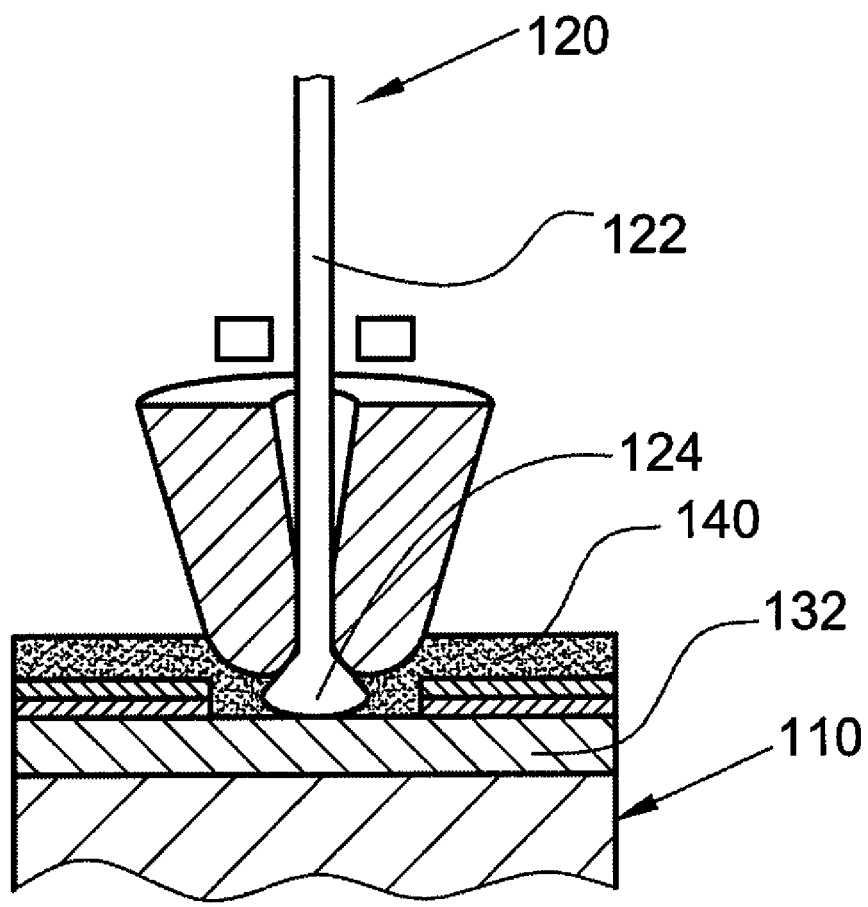
Figure 14:
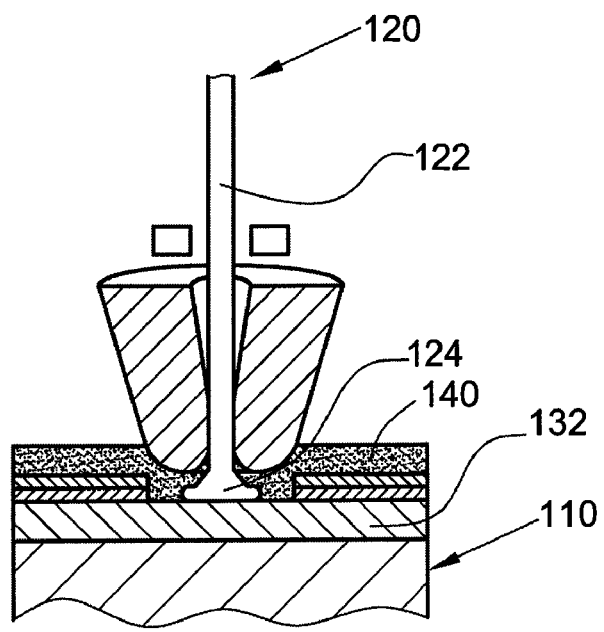
Figure 15:
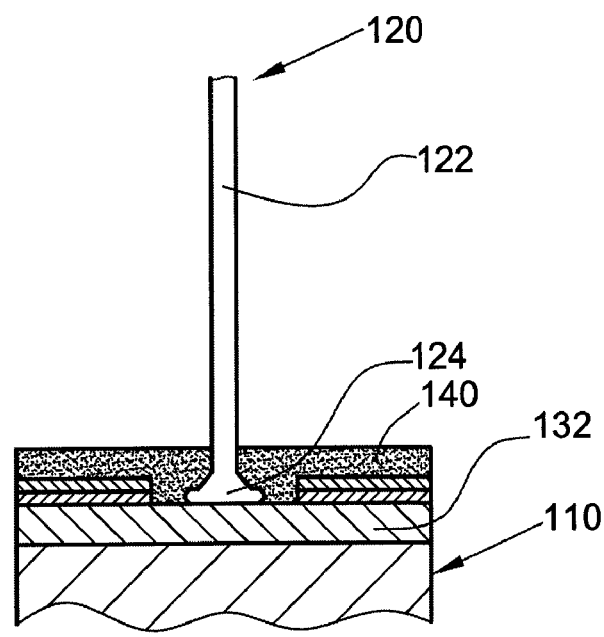

Referring to FIG. 12, the whole block portion 124 of the copper bonding wire 120 is inserted into the non-conductive adhesive material 140. Referring to FIG. 13, the block portion 124 is moved for contacting the aluminum pad 132, and is pressed and deformed by a pressing process. Referring to FIG. 14, the block portion 124 of the copper bonding wire 120 is bonded to the aluminum pad 132 by a vibration process, wherein the non-conductive adhesive material 140 covers the aluminum pad 132 and seals the whole block portion 124 of the copper bonding wire 120. Referring to FIG. 15, the non-conductive adhesive material 140 is solidified from a half-solid state to a solid state so as to form a wire bonding structure and a method for enhancing the bond of a bonding wire of the present invention.

Figure 16:
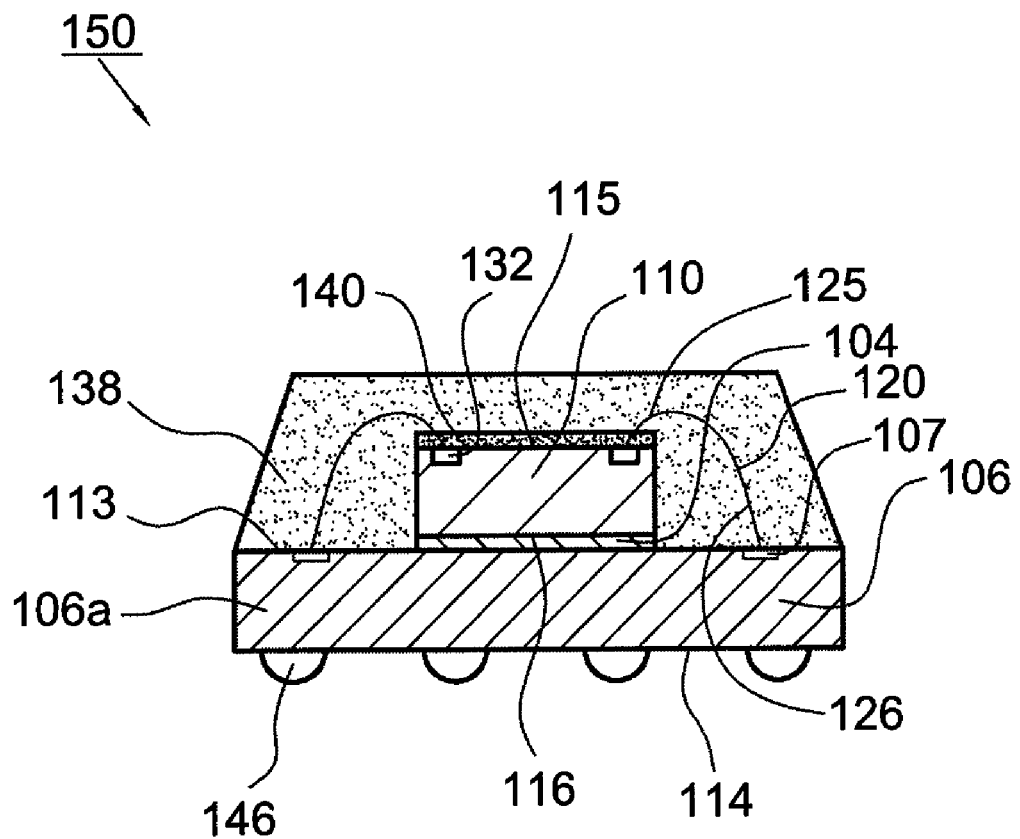

Referring to FIG. 16, the carrier 106 can be a substrate 106a, one end 125 of the copper bonding wire 120 is electrically connected to the aluminum pad 132, the other end 126 of the copper bonding wire 120 can be electrically connected to a pad 107 of the carrier 106. The substrate 106a includes external electrical contacts 146 located on the second surface 114.

Referring to FIG. 16 again, finally the chip 110 and the copper bonding wire 120 are sealed, and the carrier 106 is covered by a molding compound 138 so as to form a package, i.e. a semiconductor package 150 of the present invention, thereby finishing the method for manufacturing a semiconductor package of the present invention.

According to the wire bonding structure of the present invention, the non-conductive adhesive material covers the aluminum pad and seals the whole block portion of the copper bonding wire, thereby enhancing the bond between the copper bonding wire and the aluminum pad. Furthermore, according to the above-mentioned wire bonding structure of the present invention, the non-conductive adhesive material covers the aluminum pad and seals the whole block portion of the copper bonding wire, thereby generating the effect upon mold lock. In addition, the non-conductive adhesive material covers the aluminum pad and seals the whole block portion of the copper bonding wire, thereby preventing the copper bonding wire from oxidation and electric leakage so as to cause the aluminum pads to have fine pitch.

Figure 17:
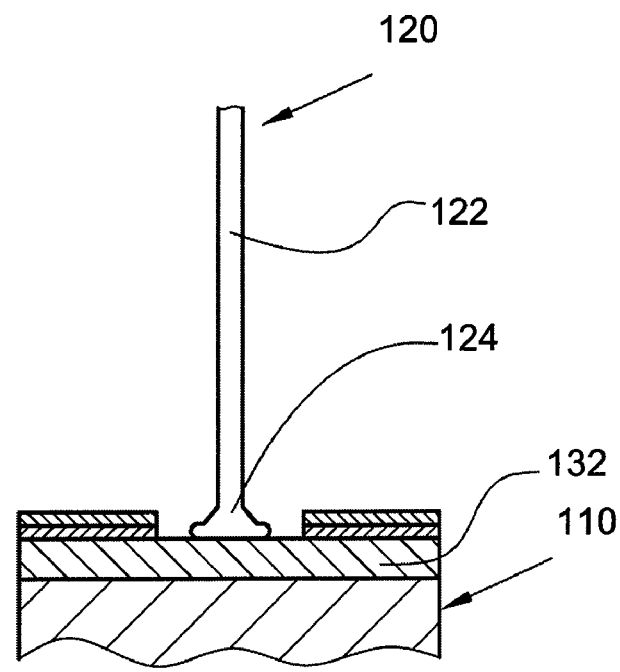
FIGS. 17 and 18 are cross-sectional views showing a method for enhancing the bond of a bonding wire according to the second embodiment of the present invention.
Figure 18:
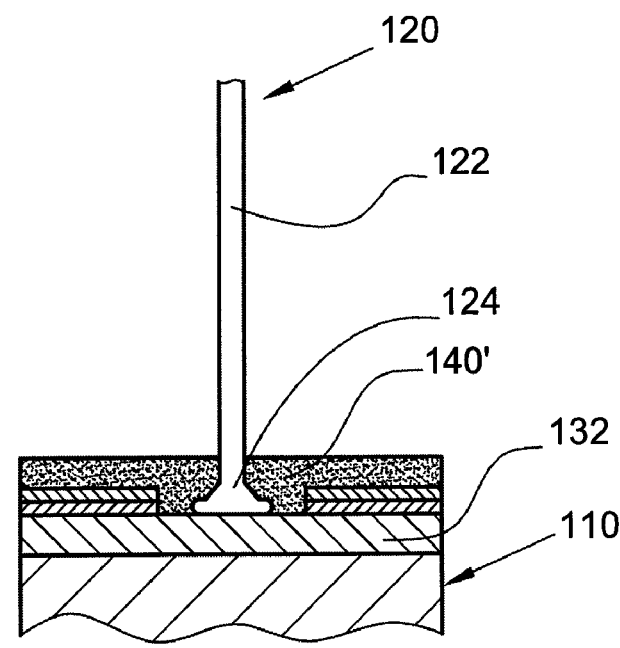

Referring to FIGS. 17 to 18, they depict a method for manufacturing a semiconductor package according to the second embodiment of the present invention. The method for manufacturing a semiconductor package according to the second embodiment is substantially similar to the method for manufacturing a semiconductor package according to the first embodiment, wherein the same elements are designated with the same reference numerals. The difference between the first and second embodiments is that the method for enhancing the bond of a bonding wire in the second embodiment includes the following steps. Referring to FIG. 17, the block portion 124 of the copper bonding wire 120 is firstly bonded to the aluminum pad 132. Referring to FIG. 18, then the aluminum pad 132 is covered by a non-conductive adhesive material 140', and the whole block portion 124 of the copper bonding wire 120 is sealed by the non-conductive adhesive material 140'. Finally, the non-conductive adhesive material 140' is solidified from a liquid state to a sold state so as to form a wire bonding structure of the present invention.

According to the wire bonding structure of the present invention, the non-conductive adhesive material covers the aluminum pad and seals the whole block portion of the copper bonding wire, thereby enhancing the bond between the copper bonding wire and the aluminum pad. Furthermore, according to the above-mentioned wire bonding structure of the present invention, the non-conductive adhesive material covers the aluminum pad and seals the whole block portion of the copper bonding wire, thereby generating the effect upon mold lock. In addition, the non-conductive adhesive material covers the aluminum pad and seals the whole block portion of the copper bonding wire, thereby preventing the copper bonding wire from oxidation and electric leakage so as to cause the aluminum pads to have fine pitch.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:
1. A semiconductor package comprising:
a carrier;
a chip disposed on the carrier, wherein the chip has a first surface and a second surface opposite to the first surface, and the chip comprises a pad disposed on the first surface;
a bonding wire for electrically connecting the chip to the carrier, wherein the bonding wire comprises a line portion and a block portion, the block portion is physically connected to the line portion, a sectional area of the block portion is bigger than that of the line portion, and the block portion is bonded to the pad;
a non-conductive adhesive material covering the pad and sealing the whole block portion of the bonding wire, the non-conductive adhesive material having a thickness less than a height between the pad and a highest position of the bonding wire; and a molding compound for sealing the chip and the bonding wire and covering the carrier.

2. The semiconductor package as claimed in claim 1, wherein the block portion is one of spherical and non-spherical block portion.

3. The semiconductor package as claimed in claim 1, wherein the bonding wire is a copper bonding wire.

4. The semiconductor package as claimed in claim 1, wherein the pad is an aluminum pad.

5. The semiconductor package as claimed in claim 1, wherein the pad of the chip is electrically connected to one end of the bonding wire, and the carrier includes another pad electrically connected to the other end of the bonding wire.

6. The semiconductor package as claimed in claim 1, wherein the carrier has an upper surface and a lower surface opposite to the upper surface, and the second surface of the chip is located on the upper surface of the carrier.

7. A method of manufacturing a semiconductor package comprising:

providing a wafer, wherein the wafer defines a plurality of chips arranged in array manner, and each chip includes at least one pad;

forming a non-conductive adhesive material on the pad;

sawing the wafer so as to form the chips;

mounting the chip on a carrier;

providing a bonding wire comprising a line portion and a block portion, wherein the block portion is physically connected to the line portion, and a sectional area of the block portion is bigger than that of the line portion;

inserting the whole block portion of the copper bonding wire into the non-conductive adhesive material;

electrically connecting the chip to the carrier by the bonding wire, wherein the block portion of the bonding wire is boned to the pad, and the non-conductive adhesive material covers the pad and seals the whole block portion of the bonding wire;

solidifying the non-conductive adhesive material from a half-solid state to a solid state; and sealing the chip and the bonding wire and covering the carrier by a molding compound, so as to form a package.

8. The method as claimed in claim 7, wherein the forming step of the non-conductive adhesive material on the pad comprises the following step:

forming the non-conductive adhesive material on the pad by a spin coating process.

9. The method as claimed in claim 8, wherein the forming step of the non-conductive adhesive material on the pad further comprises the following step:

solidifying the non-conductive adhesive material from a liquid state to a half-solid state.

10. The method as claimed in claim 7, wherein the forming step of the non-conductive adhesive material on the pad comprises the following step:

forming the non-conductive adhesive material on the pad by a printing process.

11. The method as claimed in claim 10, wherein the forming step of the non-conductive adhesive material on the pad further comprises the following step:

solidifying the non-conductive adhesive material from a liquid state to a half-solid state.

12. The method as claimed in claim 7, wherein the forming step of the non-conductive adhesive material on the pad comprises the following step:

solidifying the non-conductive adhesive material from a half-solid state to a solid state.

13. The method as claimed in claim 7, wherein the block portion is one of spherical and non-spherical block portion.

14. The method as claimed in claim 7, wherein the bonding wire is a copper bonding wire.

15. The method as claimed in claim 7, wherein the pad is an aluminum pad.

16. A method of manufacturing a semiconductor package comprising:

providing a wafer, wherein the wafer defines a plurality of chips arranged in array manner, and each chip includes at least one pad;

sawing the wafer so as to form the chips;

mounting the chip on a carrier;

providing a bonding wire comprising a line portion and a block portion, wherein the block portion is physically connected to the line portion, and a sectional area of the block portion is bigger than that of the line portion;

electrically connecting the chip to the carrier by the bonding wire, wherein the block portion of the bonding wire is boned to the pad;

forming a non-conductive adhesive material on the pad, wherein the non-conductive adhesive material is formed to cover the pad and to seal the whole block portion of the bonding wire, and the non-conductive adhesive material having a thickness less than a height between the pad and a highest position of the bonding wire;

solidifying the non-conductive adhesive material from a liquid state to a solid state; and sealing the chip and the bonding wire and covering the carrier by a molding compound, so as to form a package.

17. The method as claimed in claim 16, wherein the forming step of the non-conductive adhesive material on the pad comprises the following step:

solidifying the non-conductive adhesive material from a half-solid state to a solid state.

18. The method as claimed in claim 16, wherein the block portion is one of spherical and non-spherical block portion.

19. The method as claimed in claim 16, wherein the bonding wire is a copper bonding wire.

20. The method as claimed in claim 16, wherein the pad is an aluminum pad.

* * * * *